United States Patent [19]

Itoh et al.

[11] Patent Number: 4,586,169
[45] Date of Patent: Apr. 29, 1986

[54] SEMICONDUCTOR MEMORY CIRCUIT AND LARGE SCALE INTEGRATED CIRCUIT USING THE SAME

[75] Inventors: Hiroyuki Itoh, Kokubunji; Akira Masaki, Tokyo; Hiroki Yamashita, Ome; Satoshi Hososaka, Higashiyamato, all of Japan

[73] Assignee: Hitachi, Ltd., Tokyo, Japan

[21] Appl. No.: 440,723

[22] Filed: Nov. 10, 1982

[30] Foreign Application Priority Data

Nov. 16, 1981 [JP] Japan ................................ 56-182268

[51] Int. Cl.[4] ........................ G11C 7/00; G11C 11/40; G11C 15/00
[52] U.S. Cl. ...................................... 365/190; 365/63; 365/49; 307/455
[58] Field of Search ............... 365/174, 154, 190, 189, 365/63, 49; 357/46, 45; 307/455, 467, 471

[56] References Cited

U.S. PATENT DOCUMENTS

| | | | |
|---|---|---|---|
| 3,365,707 | 6/1967 | Mayhew | 365/72 |
| 3,538,348 | 7/1967 | Hillis et al. | 365/190 |
| 3,705,390 | 12/1972 | Mundy | 365/49 |
| 3,808,475 | 4/1974 | Buelow et al. | 357/45 |
| 4,009,472 | 2/1977 | Jones | 365/174 |
| 4,249,193 | 2/1981 | Balyoz et al. | 357/45 |
| 4,278,897 | 7/1981 | Ohno et al. | 307/455 |
| 4,298,961 | 11/1981 | Hotta et al. | 365/189 |
| 4,408,134 | 10/1983 | Allen | 307/455 |

OTHER PUBLICATIONS

Gonauser et al, "A Master-Slice Design Concept Based on Master Cells in ESFI-SOS-CMOS Technology", Siemens Forschungs-und Entwicklungsberichte, vol. 5, No. 6, pp. 344-349, 1976.

Braeckelmann et al, "A Subnanosecond Masterslice Array Offering Logic Plus Memory", IEEE ISSCC, Feb. 14, 1979, pp. 64-65.

Fields, "Low Voltage Memory Cell", IBM Technical Disclosure Bulletin, vol. 22, No. 10, Mar. 1980, pp. 4555.

Primary Examiner—James W. Moffitt
Assistant Examiner—Glenn A. Gossage
Attorney, Agent, or Firm—Antonelli, Terry & Wands

[57] ABSTRACT

A large scale integrated circuit including therein a logical gate circuit and a memory circuit is disclosed in which a large number of circuit blocks each having the same structure and including at least eight transistors and at least five resistors are arranged on a chip, and the logical gate circuit or memory circuit has a selected wiring pattern of the transistors and resistors included in the circuit block.

14 Claims, 6 Drawing Figures

LOGIC GATE / MEMORY CELL

SEMICONDUCTOR MEMORY CIRCUIT AND LARGE SCALE INTEGRATED CIRCUIT USING THE SAME

BACKGROUND OF THE INVENTION

The present invention relates to a semiconductor memory circuit, and more particularly to a semiconductor memory circuit suited for higher levels of integration and the circuit design of LSI and to a large scale integrated circuit (LSI) in which the above memory circuit and a logic circuit coexist.

In order to reduce the signal transmission delay between chips or between packages and to achieve quick access to a memory, both of a memory integrated circuit (memory IC) and a logic IC have hitherto been formed on one chip. Even in such an LSI including therein memories and logical gates, it has been desired to lower the manufacturing costs and time by using the masterslice method carried out in a logic LSI. The term "masterslice method" means a method in which circuit elements such as transistors and resistors are previously formed using common diffusion masks, and then different wiring patterns are formed between the circuit elements by replacing masks for wiring, thereby forming various kinds of LSI's. An LSI in which both memory and logic gate functions are integrated and the logic gate function is formed by the masterslice method is proposed in, for example, "ISSCC Digest of Technical Papers" 1979, pp. 64, 65 and 280. In such an LSI, however, the logic state portion can be formed by the masterslice method but the memory portion is built in the LSI, and therefore the degree of freedom with respect to each of the memory capacity and bit configuration is small. Since the memory portion and logical gate portion are formed independently of each other or circuit elements for memory and circuit elements for logical gates are formed independently of each other, there is a fair possibility of the utilization factor of each of the circuit element and chip area being lowered. Accordingly, the above LSI is not always favorable with respect to integration namely, packing density.

SUMMARY OF THE INVENTION

An object of the present invention is to provide a large scale integrated circuit which includes therein both memory and logic gate functions, has a high packing density, and has a high degree of freedom with respect to each of the memory capacity, bit configuration and logic gate configuration, and is to provide a memory circuit suitable for use in the LSI.

In order to attain the above object, a conventional memory circuit used in an LSI has been improved. A memory circuit according to the present invention is made up of circuit elements which can be used to form a logic gate circuit. In other words, it is not required to provide in a masterslice array a circuit block for forming a memory cell and a different circuit block for forming a logic gate, but a multiplicity of similar circuit blocks are formed using common diffusion masks and either a memory cell or a logic gate is formed of one of the circuit blocks only by replacing masks for wiring. The term "circuit block" means a circuit unit which includes a plurality of circuit elements such as transistors and resistors to perform a circuit function, and is repeatedly arranged in a masterslice array.

According to the present invention, a memory portion and a logic gate portion can coexist in a desired manner in an LSI, and moreover can be formed by the master-slice method. Thus, the degree of freedom with respect to the circuit configuration of the LSI is increased, and the utilization factor of each of the circuit element and chip area is improved, thereby enhancing the packing density.

DESCRIPTION OF THE PREFERRED EMBODIMENTS

Figure 1:
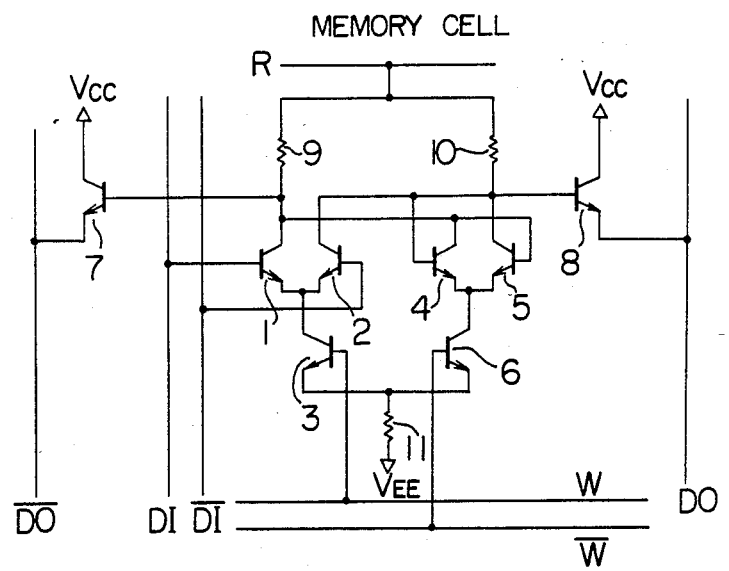
FIG. 1 is a circuit diagram showing an embodiment of a memory cell according to the present invention.

FIG. 1 shows the circuit configuration of a memory cell according to the present invention.

Referring to FIG. 1, the emitters of transistors 1 and 2 are connected to each other and connected to the collector of a transistor 3. The bases of the transistors 1 and 2 are connected respectively to data input lines DI and $\overline{DI}$ which are supplied with 180° out-of-phase input signals. The collector of the transistor 1 is connected to the collector of a transistor 4 and connected through a resistor 9 to a read-out word line R, and the collector of the transistor 2 is connected to the collector of a transistor 5 and connected through a resistor 10 to the read-out word line R. The emitters of the transistors 4 and 5 are connected to each other and further connected to the collector of a transistor 6. The base of each of the transistors 4 and 5 is connected to the collector of the other transistor. The emitters of the transistors 3 and 6 are connected to each other and further connected through a resistor 11 to a power supply $V_{EE}$. The bases of the transistors 3 and 6 are connected respectively to write-in word lines W and $\overline{W}$ which are supplied with 180° out-of-phase signals. The bases of transistors 7 and 8 are connected to the collectors of the transistors 1 and 4 and the collectors of the transistors 2 and 5, respectively. The collectors of the transistors 7 and 8 are connected to a power supply $V_{CC}$, and the emitters of the transistors 7 and 8 are connected respectively to data output lines $\overline{DO}$ and DO for outputting 180° out-of-phase signals. The circuit shown in FIG. 1 can store therein one-bit data. When the voltage of the power supply $V_{CC}$ is 0 V, the voltage of the power supply $V_{EE}$ is made nearly equal to $-3$ V to operate the circuit.

Next, explanation will be made of the operation of the circuit shown in FIG. 1. When data is held in the memory cell, the read-out word line R is kept at a low potential for example, $-1.3$ V, and the write-in word lines W and $\overline{W}$ are kept at a low potential for example, $-2.1$ V and a high potential for example, $-1.7$ V, respectively. Accordingly, of the transistors 3 and 6 whose bases are connected respectively to the write-in word lines W and $\overline{W}$ and whose emitters are connected to each other, the transistor 6 allows a current to flow therethrough. Further, the current flows through either one of the transistors 4 and 5 in accordance with the contents of the data. Now, let us define the state that the transistor 4 is conductive, as the state of "1". In this state, the current flows through the transistor 4 and resistor 9, and therefore the collector of the transistor 4 is kept at a low potential for example, $-1.6$ V. Further, since the collector of the transistor 4 is connected to the base of the transistor 5, the transistor 5 becomes nonconductive. Thus, the collector of the transistor 5 is kept at the same potential for example, $-1.3$ V as the read-out word line R through the resistor 10. Accordingly, when the data is held in the memory cell, the lower ends of the resistors 9 and 10, that is, the collectors of the transistors 4 and 5 are kept at $-1.6$ V and $-1.3$ V, respectively, by way of example. These potentials $-1.6$ V and $-1.3$ V are complementary potentials, and also are applied to the bases of the transistors 5 and 4, respectively, to hold the data. In the state that the data is held, the transistors 1 and 2 are not operated, since the transistor 3 is made nonconductive.

Next, the read-out operation will be explained. When the data is read out, the potential of the read-out word line R is made high (for example, is made equal to $-0.8$ V). As a result, the potentials at the lower ends of the resistors 9 and 10 are raised from $-1.6$ V and $-1.3$ V in the data holding state to $-1.1$ V and $-0.8$ V, respectively. These potentials $-1.1$ V and $-0.8$ V are changed by emitter-follower transistors 7 and 8 to potentials $-1.9$ V and $-1.6$ V, respectively. These potentials $-1.9$ V and $-1.6$ V appear on the data output lines $\overline{DO}$ and DO, respectively. A plurality of memory cells are arranged in the digit direction, and the emitters of the emitter-follower transistors 7 and 8 in each of the memory cells are connected to the data output lines $\overline{DO}$ and DO, respectively, to form a wired OR configuration. Thus, the potentials at a selected word (which is indicated by raising the potential of the read-out word line R) appear on the data output lines DO and $\overline{DO}$. That is, output signals are applied to the data output lines DO and $\overline{DO}$ in a differential manner.

Next, the write-in operation will be explained. In the data holding state, the write-in word lines W and $\overline{W}$ are kept at the low potential (for example, $-2.1$ V) and the high potential (for example, $-1.7$ V), respectively, and therefore the transistors 3 and 6 are made non-conductive and conductive, respectively. When data is written in the memory cell, the write-in word lines W and $\overline{W}$ are supplied with the high potential (for example, $-1.7$ V) and the low potential (for example, $-2.1$ V), respectively, in order that a current does not flow through the transistor 6 but flows through the transistor 3. Then, either one of the transistors 1 and 2 is made conductive in accordance with input data supplied from the data input lines DI and $\overline{DI}$ which are connected to the bases of the transistors 1 and 2, respectively. As a result, a current flows through either one of the resistors 9 and 10. As mentioned previously, the lower ends of the resistors 9 and 10 are connected to the bases of a pair of transistors 5 and 4 for holding data, respectively. Accordingly, when the write-in word lines are restored to the original state (that is, the lines W and $\overline{W}$ are supplied with the low and high potentials, respectively), the conductive or nonconductive state of the transistor 1 is transferred to the transistor 4, and the conductive or nonconductive state of the transistor 2 is transferred to the transistor 5. Thus, the data is held by the transistors 4 and 5.

Figure 2:
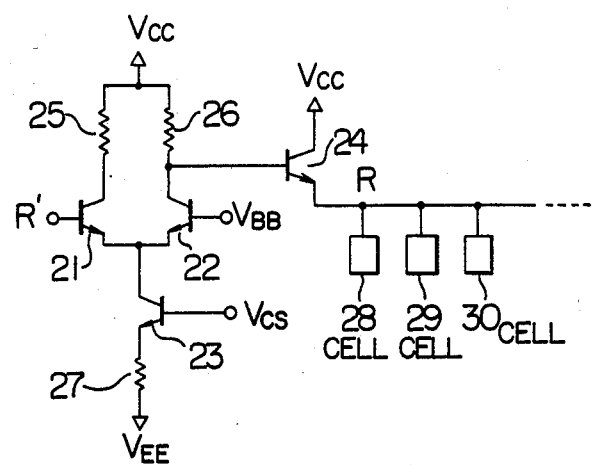
FIGS. 2 and 3 show a read-out word line driver for driving the memory cell shown in FIG. 1 and a sense circuit, respectively.

FIG. 2 shows an example of a circuit for driving the read-out word line R. Referring to FIG. 2, the emitters of transistors 21 and 22 are connected to each other, and further connected to the collector of a transistor 23. The collectors of the transistors 21 and 22 are connected to the power supply $V_{CC}$ through resistors 25 and 26, respectively. The base of the transistor 21 is supplied with a read-out signal R', and the base of the transistor 22 is supplied with a reference voltage $V_{BB}$. The output from the collector of the transistor 22 is applied to the base of an emitter-follower transistor 24 and taken out from the emitter thereof. The collector of the transistor 24 is connected to the power supply $V_{CC}$. A constant voltage $V_{CS}$ is applied to the base of the transistor 23, and the emitter thereof is connected to the power supply $V_{EE}$ through a resistor 27, to form a constant current circuit. The emitter of the emitter-follower transistor 24 is connected to the read-out word line R for memory cells 28, 29 and 30 each having the circuit configuration shown in FIG. 1. When the potential of the read-out R' is raised from a low level to a high level (for example, from $-1.3$ V to $-0.8$ V), the transistor 21 is made conductive and a current flows through the resistor 25. Thus, the transistor 22 becomes nonconductive, and the potential of the collector of the transistor 22 is raised from a low level to a high level. As a result, the potential of the read-out word line R is raised from a low level to a high level (for example, from $-1.3$ V to $-0.8$ V) through the aid of the emitter-follower transistor 24, and thus the previously-mentioned read-out operation is performed.

Figure 3:
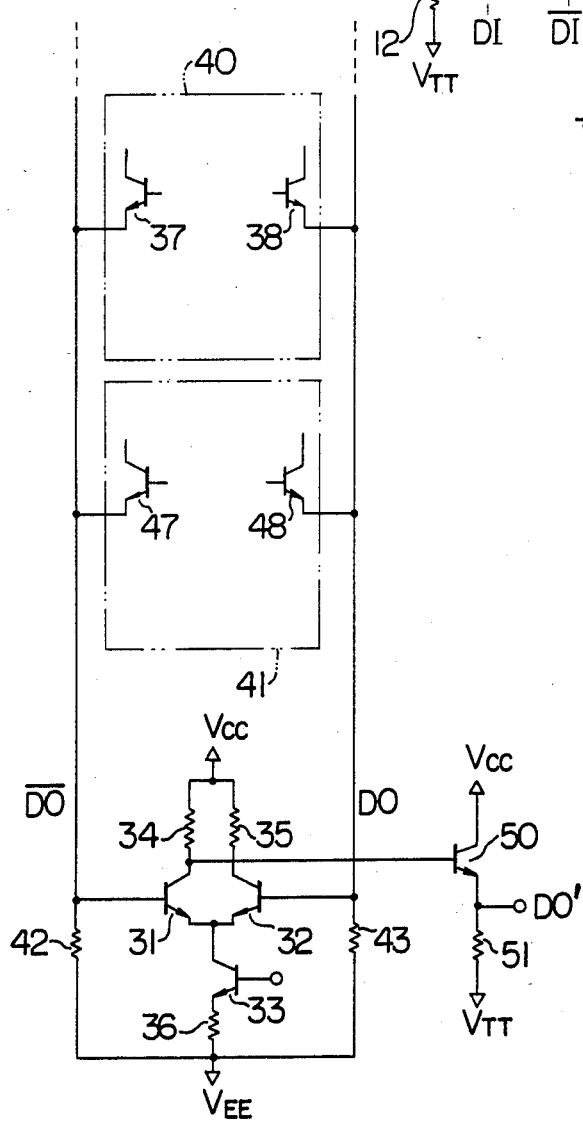

FIG. 3 shows an example of a sense circuit for data outputs. Referring to FIG. 3, emitter-follower transistors 37 and 47 which are included respectively in memory cells 40 and 41 arranged in the digit direction and correspond to the transistor 7 shown in FIG. 1, are wired-ORed, and also emitter-follower transistors 38 and 48 corresponding to the transistor 8 shown in FIG. 1 are wired-ORed. The signals from the transistors 37 and 47 and the signals from the transistors 38 and 48 respectively are applied to the bases of transistors 31 and 32 in a differential manner. The emitters of the transistors 31 and 32 are connected to each other, and further connected to the collector of a transistor 33. The collector of the transistor 31 is connected to the base of a transistor 50. A difference between signals DO and $\overline{DO}$ from the memory cells is amplified by the transistors 31 and 32, and then is delivered as an output signal DO' through an emitter-follower circuit, which is formed by connecting the emitter of the transistor 50 to a power supply $V_{TT}$ through a resistor 51. The emitter of the transistor 33 is connected to the power supply $V_{EE}$ through a resistor 36 to form a constant current circuit.

Figure 4:
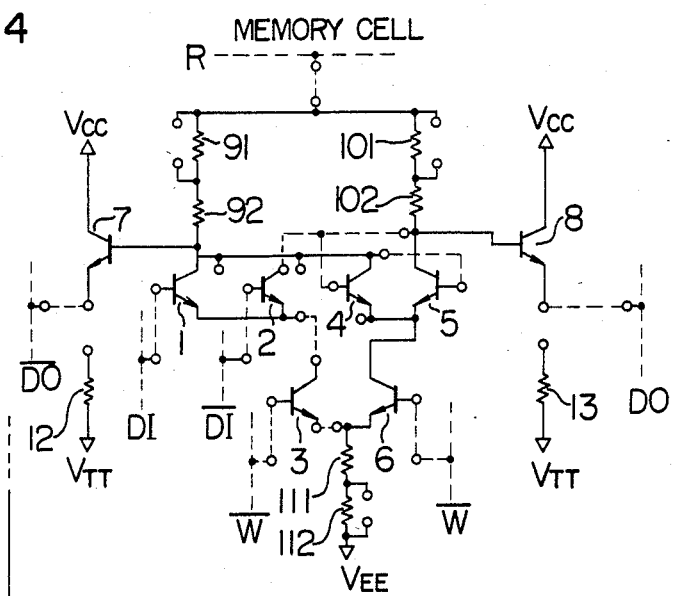
FIGS. 4 and 5 show a memory cell and a logical gate which are formed of the same circuit blocks by using different wiring patterns, respectively.
Figure 5:
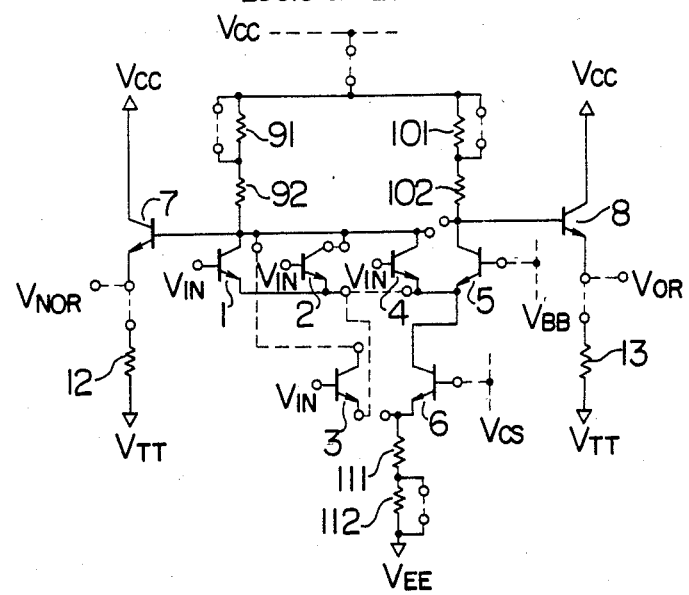

FIGS. 4 and 5 are circuit diagrams showing that a circuit block for forming a memory cell according to the present invention can be used to form the memory cell or a logical gate by changing the wiring pattern in the circuit block. That is, on a wafer or chip are formed a large number of circuit blocks each including light transistors and five resistors required for forming a memory cell such as shown in FIG. 4 and a logical gate such as shown in FIG. 5. One of the memory cells shown in FIG. 4 and the logical gate shown in FIG. 5 is formed by changing the wiring between circuit elements (namely, the transistors and resistors). In FIGS. 4 and 5, a wiring pattern indicated by solid lines is necessary to form both of the memory cell and logical gate, and one or the other of wiring patterns indicated by broken lines is selected according as the memory cell or logical gate is formed. FIG. 4 shows the wiring in a memory cell according to the present invention, and FIG. 5 shows the wiring in a 4-input OR/NOR gate formed of an emitter-coupled logic (ECL) circuit. Referring to FIGS. 4 and 5, the resistors 9, 10 and 11 shown in FIG. 1 are divided into resistors 91 and 92, resistors 101 and 102, and resistors 111 and 112, respectively. Center taps are provided between the resistors 91 and 92, between the resistors 101 and 102, and between the resistors 111 and 112, to make the circuit current of the memory cell different from the circuit current of the logical gate. In the case where a plurality of memory cells are formed in the direction of digit, the outputs of these memory cells are wired-ORed, and therefore resistors 12 and 13 for forming an emitter-follower circuit are used only in one of such memory cells.

Now, the ECL circuit shown in FIG. 5 will be briefly explained. The emitters of the transistors 1 to 4 are connected to each other, and further connected to the collector of the transistor 6 and the emitter of the transistor 5. The bases of the transistors 1 to 4 are supplied with input signals $V_{IN}$. Further, the collectors of the transistors 1 to 4 are connected to each other, and also are connected to the power supply $V_{CC}$ through the resistor 92 to deliver an NOR output. The reference voltage $V_{BB}$ is applied to the base of the transistor 5, and the collector thereof is connected to the power supply $V_{CC}$ through the resistor 102 to deliver an OR output. The constant voltage $V_{CS}$ is applied to the base of the transistor 6, and the emitter thereof is connected to the power supply $V_{EE}$ through the resistor 111 to form a constant current circuit. The NOR and OR outputs are applied to the bases of the transistors 7 and 8, respectively, and the emitters of the transistors 7 and 8 are connected to the power supply $V_{TT}$ through the resistors 12 and 13, respectively, to form emitter-follower circuits. Thus, output signals $V_{NOR}$ and $V_{OR}$ are delivered from the emitters of the transistors 7 and 8, respectively.

As can be seen from FIGS. 4 and 5, a memory cell according to the present invention can be formed of a circuit block which includes circuit elements necessary to form at least a 4-input ECL gate, without using any additional circuit elements. Moreover, the memory cell and the ECL gate utilize almost all of the circuit elements included in the circuit block in common. Further, as can be seen from FIGS. 2, 3 and 5, the read-out word line driver, write-in word line driver, data input digit line driver and sense circuit each for operating a memory cell according to the present invention can be formed using the logical gate or a modified version thereof. Accordingly, an LSI including therein a memory and a logical gate can be formed of circuit blocks of one kind by the masterslice method, and moreover the memory capacity, word/bit configuration, and logical gate configuration can be freely changed. Further, since the memory cell and the logical gate utilize almost all of circuit elements of circuit block in common, the utilization factor of each of the circuit element and chip area can be increased as a whole.

Figure 6:
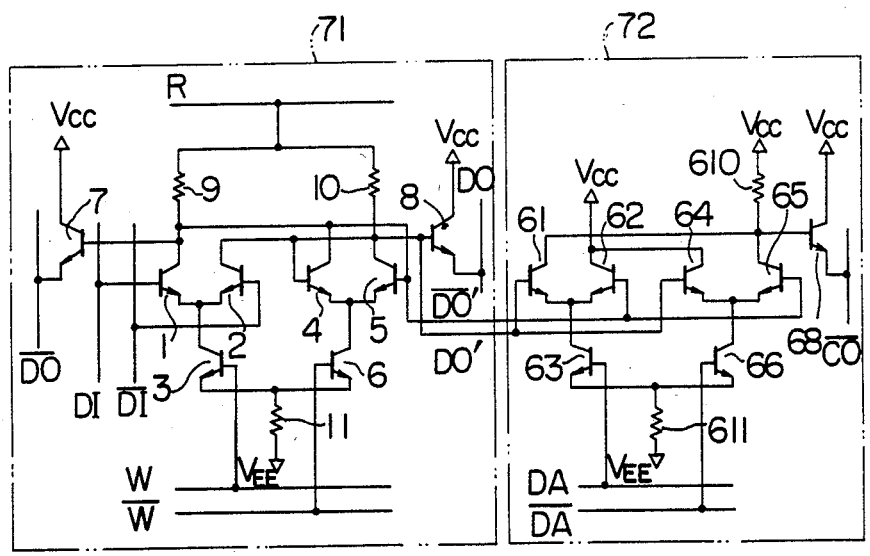
FIG. 6 is a circuit diagram showing another embodiment of a memory cell according to the present invention which has an associative function.

FIG. 6 shows another embodiment of a memory circuit according to the present invention. The embodiment shown in FIG. 6 is a memory circuit in which an association function is added to the embodiment shown in FIG. 1. In FIG. 6, reference numeral 71 designates the same memory cell as shown in FIG. 1, and 72 an exclusive OR (EXOR) circuit for associative function. The fundamental circuit construction of the circuit 72 includes two-stage series gates as in the memory cell 71. In the exclusive OR circuit 72, transistors 63 and 66 corresponding to the lower-stage transistors 3 and 6 which are included in the memory cell 71 and connected to the write-in word lines W and $\overline{W}$, are connected to associative data lines DA and $\overline{DA}$, respectively. Further, upper-stage transistors 61, 62, 64 and 65 are connected to the collectors of the transistors 4 and 5 of the memory cell 71 in a manner as illustrated. (The potentials of the collectors of the transistors 4 and 5 are expressed by $\overline{DO'}$ and DO', respectively.) In more detail, the bases of the transistors 61 and 64 are connected to the collector of the transistor 5, and the bases of the transistors 62 and 65 are connected to the collector of the transistor 4. Further, the collectors of the transistors 61 and 65 are connected to each other and also are connected to the power supply $V_{CC}$ through a resistor 610, and the collectors of the transistors 62 and 64 are both connected directly to the power supply $V_{CC}$. Thus, the exclusive OR operation is performed between the potential DO' and a potential on the association data line DA, and the collector voltage of the transistor 65 is outputted through an emitter-follower transistor 68 to deliver a coincidence output $\overline{CO}$. The circuit 72 for conducting the associative function uses substantially the same circuit elements as in the memory cell 71, and therefore it is evident that the circuit 72 can be readily formed of the same circuit block as used for forming the memory cell 71 by changing the wiring pattern in the circuit block, just as the memory cell and logical gate shown in FIGS. 4 and 5 can be formed of the same circuit block by changing the wiring in the circuit block.

As has been explained in the foregoing description, according to the present invention, a masterslice LSI including therein a memory and a logical gate can be obtained which is large in packing density and is very high in the degree of freedom with respect to each of the memory capacity, bit configuration and logical gate configuration.

We claim:
1. A large scale integrated circuit comprising on a substrate a plurality of logic gates and a plurality of memory cells formed independently of the logic gates, said circuit comprising:
   circuit element groups each of which has the same circuit element array and each of which can be used for forming one of said logic gates or one of said memory cells, wherein all said circuit element groups are formed in a masterslice array; and
   different wirings applied to predetermined ones of said circuit element arrays so as to form the logic gates and the memory cells from the circuit element groups on the same substrate, wherein said circuit element group is made up of a first, second, third, fourth, fifth, sixth, seventh and eighth transistors and first, second, third, fourth and fifth resistors, and each transistor having a base, a collector, and an emitter, wherein the emitters of said first and second transistors are connected to each other, the emitters of said third and fourth transistors are connected to each other, the collector of said third transistor is connected to the collector of the first transistor, one of the collectors of said first and second transistors is selectively connected to the collector of said fourth transistor, the collector of said fifth transistor is connected to the emitters of said first and second transistors, one of the emitters of said fourth and fifth transistors is selectively connected to the emitter of said sixth transistor, one of the collector and emitter of said third transistor is selectively connected to the collector of said sixth transistor, one end of said first resistor and one end of said second resistor are connected to the collectors of said first and second transistors respectively, one and the other ends of said third resistor are connected to the emitter of said fifth transistor and a low voltage source, respectively, the bases of said seventh and eighth transistors are connected to the collectors of said first and second transistors, respectively, the collectors of said seventh and eighth transistors are connected to a high voltage source, and said fourth and fifth resistors are selectively connected to the emitters of said seventh and eighth transistors, respectively.

2. A large scale integrated circuit according to claim 1, wherein the collector and base of said first transistor are connected to the base and collector of said second transistor, respectively, the collector of said fourth transistor is connected to the collector of said second transistor, the bases of said third and fourth transistors are connected to data input lines supplied with 180° out-of-phase signals, respectively, the emitter and collector of said sixth transistor are connected to the emitter of said fifth transistor and the emitter of said fourth transistor, respectively, the bases of said fifth and sixth transistors are connected to write-in word lines supplied with 180° out-of-phase signals, respectively, the emitters of said seventh and eighth transistors are connected to data output lines for outputting 180° out-of-phase signals, respectively, and the other ends of said first and second resistors are connected to a read-out word line to form said memory circuit.

3. A large scale integrated circuit according to claim 1, wherein the bases of said first, third, fourth and sixth transistors are supplied with input voltages, respectively, and the bases of said second and fifth transistors are supplied with predetermined voltages to establish an emitter-coupled logic circuit.

4. A large scale integrated circuit comprising on a substrate a plurality of logic gates and a plurality of memory cells formed independently of the logic gates, said circuit comprising:
circuit element groups each of which has the same circuit element array and each of which can be used for forming one of said logic gates or one of said memory cells, wherein all said circuit element groups are formed in a masterslice array; and
different wirings applied to predetermined ones of said circuit element arrays so as to form the logic gates and the memory cells from the circuit element groups on the same substrate, wherein an exclusive OR circuit is formed of said circuit element group by selecting a wiring pattern connecting said circuit elements, and said exclusive OR circuit is combined with said memory circuit to form a memory circuit with an associative function.

5. A semiconductor memory circuit comprising:
a first transistor circuit connected to a readout word line, said first transistor circuit for holding a predetermined data on the basis of the conductive state of a transistor in said first transistor circuit;
a second transistor circuit connected to said first transistor circuit and a pair of data input lines, said second transistor circuit for controlling the conductive state of a transistor of said first transistor circuit in accordance with signals applied to said data input lines;
a third transistor circuit connected to said first and second transistor circuits and responsive to a pair of write-in word lines, said third transistor circuit for activating a selected one of said first and second transistor circuits in accordance with differential signals applied to said write-in word lines; and
an output circuit connected to said first transistor circuit and a pair of data output lines, said output circuit for outputting said predetermined data held by said first transistor circuit to said data output lines.

6. A semiconductor memory circuit according to claim 5, wherein said third transistor circuit includes a third pair of transistors and a resistor, each transistor having a base, a collector, and an emitter, wherein respective collectors of said third pair of transistors are connected to said first and second transistor circuits, the emitter of said third pair of transistors are connected to each other and further connected to a low voltage source through said resistor, and each of the bases of said third pair of transistors is connected to a corresponding one of said write-in word lines, and wherein, in response to signals applied to said write-in word lines, one of said third pair of transistors is made conductive and one of said first and second transistor circuits is operated by the transistor which is made conductive.

7. A semiconductor memory circuit according to claim 5, wherein said output circuit includes a pair of emitter-follower transistors, each transistor having a base, a collector, and an emitter, wherein the collectors of said emitter-follower transistors are connected to a high voltage source and each of the emitters of said emitter-follower transistors is connected to a corresponding one of said data output lines, and wherein a pair of outputs of said first transistor circuit applied to respective bases of said emitter-follower transistors are shifted in level by said emitter-follower transistors, and then supplied to said data output lines.

8. A semiconductor memory circuit according to claim 5,
wherein said first transistor circuit includes a first pair of transistors and resistors, each transistor having a base, a collector, and an emitter, wherein the emitters of said first pair of transistors are connected to each other, the base of one of said first pair of transistors is connected to the collector of the other transistor, the collectors of said first pair of transistors are connected to said read-out line through said resistors, respectively, and wherein, in response to a pair of outputs of said second transistor circuit applied to the bases of said first pair of transistors, one of said first pair of transistors is made conductive and respective collector voltages of said first pair of transistors are outputted,
wherein said second transistor circuit includes a second pair of transistors, each transistor having a base, a collector, and an emitter, wherein the emitters of said second pair of transistors are connected to each other and each of the bases of said second pair of transistors is connected to a corresponding one of said data input lines, and wherein, in response to signals applied to said data input lines, one of said second pair of transistors is made conductive and the conductive state of a transistor in said first transistor circuit is controlled by respective collector voltages of said second pair of transistors, wherein said third transistor circuit includes a third pair of transistors and a resistor, each transistor having a base, a collector, and an emitter, wherein respective collectors of said third pair of transistors are connected to said first and second transistor circuits, the emitter of said third pair of transistors are connected to each other and further connected to a low voltage source through said resistor, and each of the bases of said third pair of transistors is connected to a corresponding one of said write-in word lines, and wherein, in response to signals applied to said write-in word lines, one of said third pair of transistors is made conductive and one of said first and second transistor circuits is operated by the transistor which is made conductive, and wherein said output circuit includes a pair of emitter-follower transistors, each transistor having a base, a collector, and an emitter, wherein the collectors of said emitter-follower transistors are connected to a high voltage source and each of the emitters of said emitter-follower transistors is connected to a corresponding one of said data output lines, and wherein a pair of outputs of said first transistor circuit applied to respective bases of said emitter-follower transistors are shifted in level by said emitter-follower transistors, and then supplied to said data output lines.

9. A semiconductor memory circuit according to claim 5, further comprising an exclusive OR circuit coupled with said memory circuit to form a memory circuit with an associative function.

10. A semiconductor memory circuit according to claim 5, wherein said first transistor circuit includes a first pair of transistors and resistors, each transistor having a base, a collector, and an emitter, wherein the emitters of said first pair of transistors are connected to each other, the base of one of said first pair of transistors is connected to the collector of the other transistor, the collectors of said first pair of transistors are connected to said read-out line through said resistors, respectively, and wherein, in response to a pair of outputs of said second transistor circuit applied to the bases of said first pair of transistors, one of said first pair of transistors is made conductive and respective collector voltages of said first pair of transistors are outputted.

11. A semiconductor memory circuit according to claim 10, wherein said second transistor circuit includes a second pair of transistors, each transistor having a base, a collector, and an emitter, wherein the emitters of said second pair of transistors are connected to each other and each of the bases of said second pair of transistors is connected to a corresponding one of said data input lines, and wherein, in response to signals applied to said data input lines, one of said second pair of transistors is made conductive and the conductive state of a transistor in said first transistor circuit is controlled by respective collector voltages of said second pair of transistors.

12. A semiconductor memory circuit according to claim 5, wherein said second transistor circuit includes a second pair of transistors, each transistor having a base, a collector, and an emitter, wherein the emitters of said second pair of transistors are connected to each other and each of the bases of said second pair of transistors is connected to a corresponding one of said data input lines, and wherein, in response to signals applied to said data input lines, one of said second pair of transistors is made conductive and the conductive state of a transistor in said first transistor circuit is controlled by respective collector voltages of said second pair of transistors.

13. A semiconductor memory circuit according to claim 12, wherein said third transistor circuit includes a third pair of transistors and a resistor, each transistor having a base, a collector, and an emitter, wherein respective collectors of said third pair of transistors are connected to said first and second transistor circuits, the emitter of said third pair of transistors are connected to each other and further connected to a low voltage source through said resistor, and each of the bases of said third pair of transistors is connected to a corresponding one of said write-in word lines, and wherein, in response to signals applied to said write-in word lines, one of said third pair of transistors is made conductive and one of said first and second transistor circuits is operated by the transistor which is made conductive.

14. A semiconductor memory circuit according to claim 12, wherein said output circuit includes a pair of emitter-follower transistors, each transistor having a base, a collector, and an emitter, wherein the collectors of said emitter-follower transistors are connected to a high voltage source and each of the emitters of said emitter-follower transistors is connected to a corresponding one of said data output lines, and wherein a pair of outputs of said first transistor circuit applied to respective bases of said emitter-follower transistors are shifted in level by said emitter-follower transistors, and then supplied to said data output lines.

* * * * *